(12) United States Patent
Yeh et al.

(10) Patent No.: US 9,165,835 B2
(45) Date of Patent: Oct. 20, 2015

(54) METHOD AND STRUCTURE FOR ADVANCED SEMICONDUCTOR CHANNEL SUBSTRATE MATERIALS

(75) Inventors: Ming-Hsi Yeh, Hsinchu (TW); Chun-Yi Lee, Hsinchu County (TW); Chi-Ming Yang, Hsinchu (TW); Chin-Hsiang Lin, Hsin-chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 721 days.

(21) Appl. No.: 13/221,214

(22) Filed: Aug. 30, 2011

(65) Prior Publication Data

US 2013/0052813 A1    Feb. 28, 2013

(51) Int. Cl.
  *H01L 21/425*    (2006.01)
  *H01L 21/8234*   (2006.01)
  *H01L 21/28*     (2006.01)
  *H01L 29/51*     (2006.01)

(52) U.S. Cl.
  CPC .. *H01L 21/823431* (2013.01); *H01L 21/28255* (2013.01); *H01L 21/28264* (2013.01); *H01L 29/513* (2013.01); *H01L 29/517* (2013.01)

(58) Field of Classification Search
  USPC ........................................................ 438/527
  See application file for complete search history.

(56) References Cited

U.S. PATENT DOCUMENTS 6,746,924 B1 * 6/2004 Lee et al. ................. 438/286
2009/0160020 A1 * 6/2009 Barth et al. ............... 257/532

FOREIGN PATENT DOCUMENTS

KR   1995-0005490    5/1995
KR   2005-0122652    12/2005

OTHER PUBLICATIONS

Official Action issued Feb. 4, 2013, in counterpart Korean Patent Application No. 10-2011-0124340.

* cited by examiner

*Primary Examiner* — Alexander Ghyka
(74) *Attorney, Agent, or Firm* — Duane Morris LLP

(57) ABSTRACT

Provided is a method and structure for utilizing advance channel substrate materials in semiconductor manufacturing. Advanced channel substrate materials such as germanium and Group III-V channel substrate materials, are advantageously utilized. One or more capping films including at least a nitride layer are formed over the channel substrate prior to patterning, ion implantation and the subsequent stripping and wet cleaning operations. With the capping layers intact during these operations, attack of the channel substrate material is prevented and the protective films are easily removed subsequently. The films are dimensioned in conjunction with the ion implantation operation to enable the desired dopant profile and concentration to be formed in the channel substrate material.

22 Claims, 3 Drawing Sheets

METHOD AND STRUCTURE FOR ADVANCED SEMICONDUCTOR CHANNEL SUBSTRATE MATERIALS

TECHNICAL FIELD

The disclosure relates, most generally, to integrated circuit fabrication processes, and more particularly to new materials used as channel substrates for integrated circuit and other semiconductor devices and methods for processing the new materials.

BACKGROUND OF THE DISCLOSURE

In the advancing semiconductor manufacturing industry, new substrate materials are being developed in response to the demand for greater electron and hole mobility and work function tuning. Materials such as germanium, SiGe and Group III-V materials such GaAs, InP and InGaAs are being proposed because of their lattice structures and inherent stresses which have been found to enhance electron and hole mobility in integrated circuit and other semiconductor devices. The use of these materials is particularly advantageous as device processing technologies continue to advance and devices are formed in the 10 nanometer regime.

A challenge faced in the development of these new materials as channel substrate materials lies in the incompatibility between the new channel substrate materials and conventional wet chemical processes used in semiconductor manufacturing. Wet chemical cleaning operations are commonly used in semiconductor manufacturing for various purposes including the cleaning operations that follow dry photoresist stripping operations. Wet chemical operations are also used to remove oxide layers and for other purposes. Wet chemical operations are typically used multiple times in the sequence of processing operations used to manufacture a semiconductor device. Commonly used chemicals used for wet chemical processing operations include HCl, HF, $HNO_3$, $H_2SO_4$, $NH_4OH$, APM, HPM and Caros acid (SPM). Additional chemicals are also used in other conventional wet chemical processing operations.

The new substrate materials such as Ge, SiGe and Group III-V materials are susceptible to attack by these wet chemicals used in semiconductor manufacturing. The wet chemical processing operations induce a significant amount of substrate film loss and also damage the substrate materials by roughening the surfaces to unacceptable levels. This undesirable surface morphology adversely affects subsequent processing operations.

It would therefore be desirable to formulate processing operations that are compatible with the new substrate materials that provide the aforementioned advantages.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

A channel substrate material is provided for use in semiconductor device manufacturing. The channel substrate may be used as a substrate for the formation of various integrated circuit and other semiconductor devices used in various applications, it may be used in various processing technologies and it may come in various sizes used in the semiconductor manufacturing industry. The channel substrate material may be Ge, SiGe, GaAs, InP, InGaAs or other Group III-V semiconductor materials. The channel substrate may be a relatively thick layer formed over another substrate commonly used in the semiconductor fabrication industry, e.g. over a silicon wafer. In another exemplary embodiment, the wafer itself may be formed of the channel substrate material with the channel substrate referring to the upper portion of the substrate, in which the transistor channels will be formed. The disclosure provides for forming a film structure including at least a nitride material layer over the channel substrate to protect the channel substrate during wet chemical cleaning operations commonly used in the semiconductor manufacturing industry, particularly cleaning operations and oxide removal operations. These protective layers protect the channel substrate material from being attacked and therefore losing film thickness or becoming undesirably and unacceptably roughened.

The protective film structure may advantageously be utilized early in the fabrication sequence and may remain in place over the channel substrate during one or a plurality of processing operations including a sequence of ion implantation processing operations that include the formation of a photoresist pattern, an ion implantation operation, and the removal of the photoresist pattern after the ion implantation operation followed by a wet cleaning operation. The protective film structure may advantageously be formed and utilized multiple times during the sequence of fabrication operations used to form a semiconductor device. The protective film or films are easily removed after they are utilized to prepare the channel substrate for further processing operations.

Figure 1:
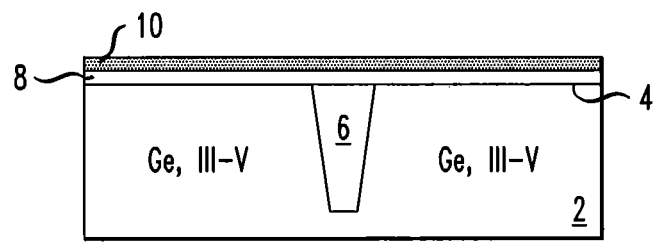
FIG. 1 is a cross-sectional view showing an exemplary protective film structure of the disclosure.

FIG. 1 is a cross-sectional view showing channel substrate 2. Channel substrate 2 may simply comprise an upper portion of a wafer, i.e. substrate formed of the channel substrate material or it may be a layer formed over a substrate formed of a further material such as a silicon or other wafer and, according to this exemplary embodiment, channel substrate 2 may include a thickness ranging from about 1000-2500 angstroms. Other suitable thicknesses may be used in other exemplary embodiments. Channel substrate 2 may be formed of a material that may be Ge, SiGe, GaAs, InP, InGaAs or other Group III-V materials which find utility as channel substrate materials in semiconductor manufacturing because they enhance device performance by enhancing electron and hole mobility due to the strain effect resulting from their lattice structures. A Group III-V material should be understood to be a material formed of a combination of elements from Group III and Group V of the periodic table of elements.

Channel substrate 2 is planar in the illustrated embodiment of FIG. 1 and includes planar surface 4. STI, shallow trench isolation, structure 6 is formed in channel substrate 2 and extends downwardly from planar surface 4 and may be produced using conventional or other means. The presence of STI structure 6 within channel substrate 2 indicates that the protective film structure of the disclosure is formed over and after the formation of STI structure 6 in this embodiment. In the illustrated embodiment, two films are formed over channel substrate 2. Lower oxide film 8 may be various oxide materials and may include a thickness of about 5-15 angstroms in one exemplary embodiment, but other thicknesses may be used in other exemplary embodiments. Lower oxide film 8 may be formed using thermal oxidation processes, CVD, ALD or other deposition processes. In other exemplary embodiments, lower oxide film 8 may be a chemical oxide film such as may be formed in a chemical processing operation that uses ozone in conjunction with deionized water, DIW. Various other oxide formation techniques may be used to form lower oxide film 8. Nitride film 10 is formed over lower oxide film 8 and may include a thickness ranging from about 5-50 angstroms in one exemplary embodiment, but other thicknesses may be used in other exemplary embodiments. Nitride film 10 may be stoichiometric $Si_3N_4$ or it may be other stoichiometric nitride layers or it may be silicon oxynitride or other nitride materials in other exemplary embodiments. Nitride layer 10 may be formed using thermal processes, CVD, ALD or other suitable film deposition techniques.

Figure 2:
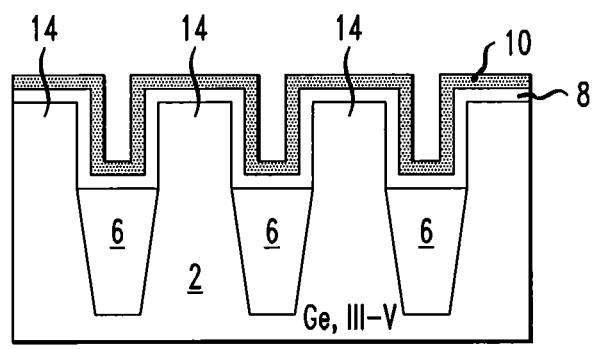
FIG. 2 is a cross-sectional view showing an exemplary protective film structure of the disclosure on a FinFET substrate.

FIG. 2 shows an embodiment in which channel substrate 2 includes fins 14. Fins 14 formed from channel substrate 2 will be used in the formation of FinFET, fin-type field effect transistor devices as commonly used in the semiconductor manufacturing industry. Lower oxide film 8 and nitride film 10 are as described above, as are STI structures 6. Fins 14 may be formed using known methods and to various dimensions.

FIGS. 1 and 2 each illustrate that lower oxide film 8 and nitride layer 10 are continuous layers, i.e. not segmented. In each of FIGS. 1 and 2, nitride layer 10 completely covers channel substrate 2. In each of FIGS. 1 and 2, nitride film 10 is directly on and contacting lower oxide film 8 which is directly on and contacting, i.e. conterminous with, channel substrate 2. Together lower oxide film 8 and nitride film 10 combine to form a dielectric film structure formed entirely of the two continuous dielectric layers of nitride layer 10 and lower oxide film 8.

Figure 3:
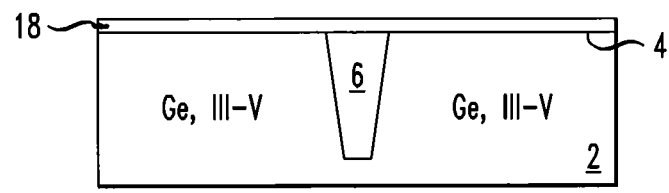
FIG. 3 is a cross-sectional view showing another exemplary protective film structure according to the disclosure.

FIG. 3 shows the planar channel substrate of FIG. 1 with a different protective film structure formed over planar surface 4 of channel substrate 2. Single cap layer 18 may be a nitride material such as silicon oxynitride, $SiO_xN_y$ or other suitable nitride materials and is a continuous layer formed directly on and conterminous with the channel substrate 2. Cap layer 18 may be formed to a thickness within the range of about 10-50 angstroms but other thicknesses may be used in other exemplary embodiments. In one exemplary embodiment, the silicon oxynitride layer may also be formed by first forming an oxide layer then using suitable nitridation techniques such as an N2 plasma or a thermal operation using NH3 to introduce nitrogen into the initially formed oxide. Other techniques for nitridizing an originally formed oxide film may also be used. In another exemplary embodiment, a silicon nitride layer may be formed initially and the film may be bombarded, implanted, or otherwise aggressively treated with oxygen such as by using an O2 plasma, to form a silicon oxynitride layer. Other techniques may be used in other exemplary embodiments to form silicon oxynitride or other materials suitably used as cap layer 18.

Although the embodiments illustrated in FIGS. 1 and 2 include a two layer protective film structure and the embodiment illustrated in FIG. 3 includes a one layer protective film structure, the protective film structure may include multiple layers including at least one nitride layer, according to other exemplary embodiments of the disclosure.

Figure 4:
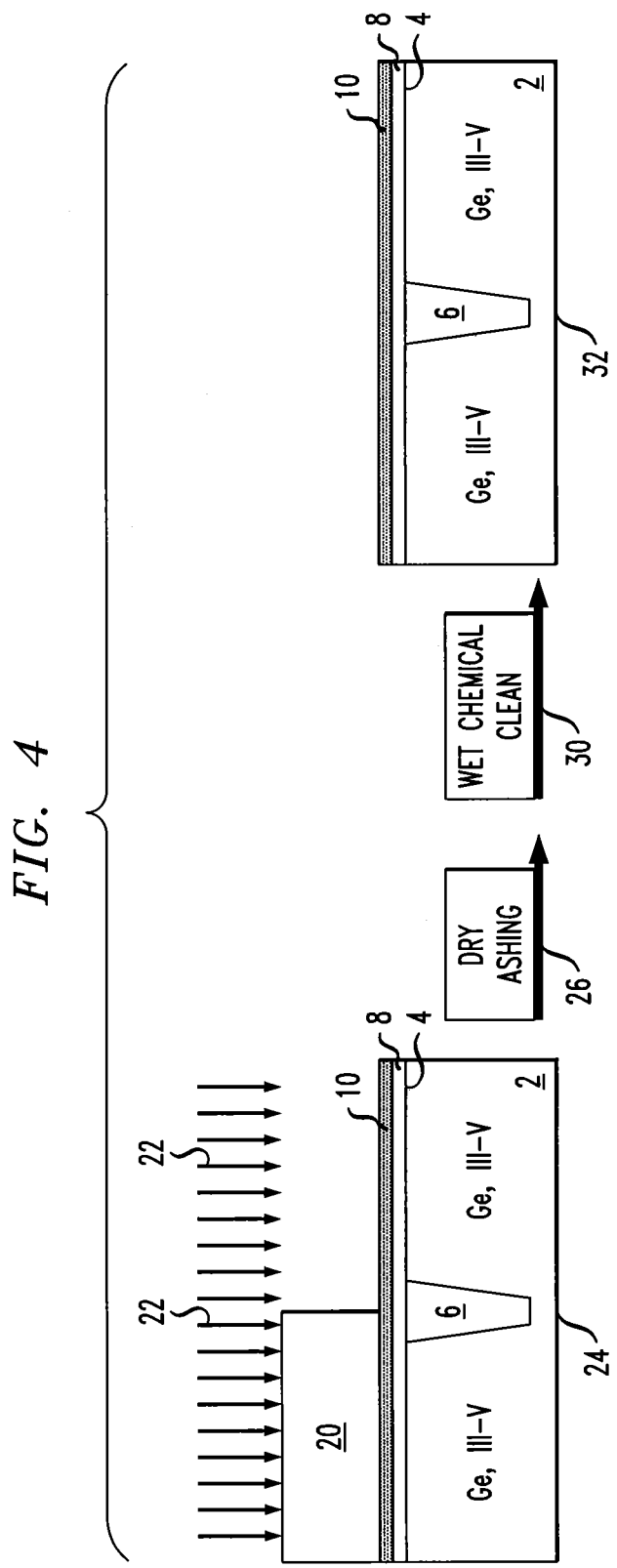
FIG. 4 shows a processing sequence according to the disclosure and includes two cross-sectional views.
Figure 5:
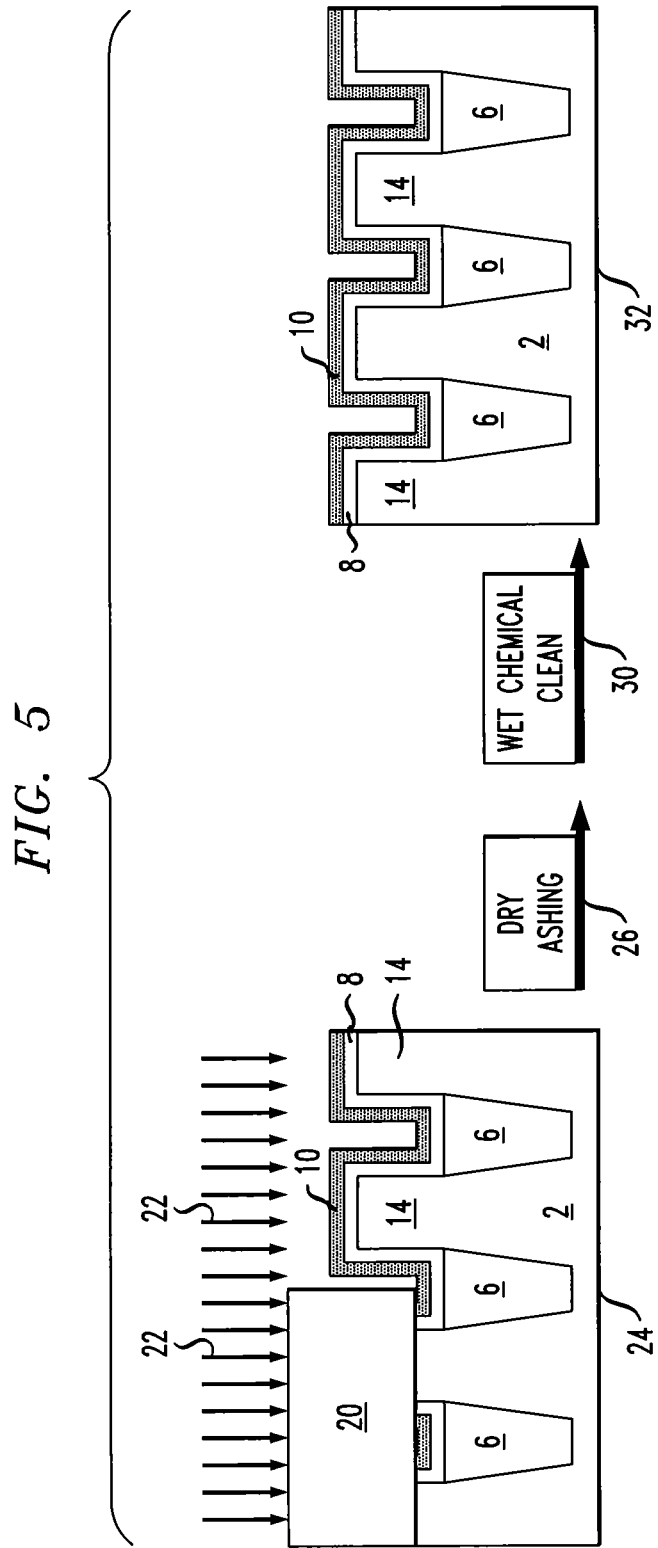
FIG. 5 illustrates a processing sequence of the disclosure performed on a FinFET structure according to the disclosure and also includes two cross-sectional views.

FIGS. 4 and 5 each illustrate the same sequence of processing operations and exhibit the utility of the protective film structure according to the disclosure. FIGS. 4 and 5 differ in that FIG. 4 shows the sequence of processing operations carried out on a planar substrate and FIG. 5 shows the sequence of processing operations being carried out on a channel substrate including fins such as suitable for FinFET technology. While the sequence of processing operations illustrates the exemplary embodiment in which a composite film structure of lower oxide film 8 and nitride film 10 are used, it is pointed out that the same sequence of processing operations may be used according to the exemplary embodiments in which the protective film structure includes multiple layers, or a single capping layer such as capping layer 18 shown in FIG. 3.

Now referring to FIGS. 4 and 5, patterned photoresist 20 has been formed and is disposed over the exemplary protective film structure of lower oxide film 8 and nitride film 10. Various photoresist materials and various suitable patterning techniques may be used. FIGS. 4 and 5 show an ion implantation operation taking place with arrows 22 indicating the presence and direction of ions being implanted into channel substrate 2 at step 24. Patterned photoresist 20 protects channel substrate 2 from being subjected to implanted ions where present. Lower oxide film 8 and nitride film 10 are formed to a thickness chosen in conjunction with the ion implantation process or processes to be carried out with lower oxide film 8 and nitride film 10 in place. The illustrated ion implantation process may be any of various types of implantation operations such as but not limited to n-well ion implantation operations and p-well ion implantation operations. Other exemplary implantation operations may involve channel formation or channel adjustment implantation operations. The film thicknesses are chosen such that the ion implantation process implants ions through lower oxide film 8 and nitride film 10 and into channel substrate 2 at suitable depths. The number type and thicknesses of protective films may be tuned for the particular device and the type and number of implantation operations that will take place with the protective film or films in place.

After the ion implantation operation has been carried out, a dry ashing operation is carried out at step 26. The dry ashing operation removes patterned photoresist 20. Various plasma ashing operations may be carried out. Wet chemical cleaning operation is next carried out at step 30. The wet chemical cleaning operation of step 30 is used to remove residual photoresist and to further clean and prepare the channel substrate for further processing. The wet chemical cleaning operation may be a Caros acid clean in one exemplary embodiment. A Caros clean is also known as piranha or an SPM clean and involves a mixture of $H_2SO_4$ and $H_2O_2$ typically in a 1:4 ratio. Other cleaning operations may be used in other exemplary embodiments. Other cleaning solutions include HCl in various compositions, HF, an HF/HCl mixture, $HNO_3$, $H_2SO_4$, $NH_4OH$, APM (ammonium hydrogen peroxide mixture) and HPM, (an HCl, hydrogen peroxide mixture) and the APM and HPM mixtures may consist of various ratios. After the dry ashing operation of step 26 and wet chemical cleaning operation of step 30, all residual photoresist and other debris is removed and channel substrate 2 with lower oxide film 8 and nitride film 10 is clean as shown in step 32, the right-hand side of FIGS. 4 and 5.

According to one exemplary embodiment, a further patterned photoresist material may be formed over the cleaned structure illustrated in step 32 of FIGS. 4 and 5 and a further sequence of ion implantation processing operations, as described infra, may be carried out. In various exemplary embodiments, multiple such sequences of ion implantation processing sequences may be carried out using the same film structure.

The illustrated sequence of processing operations shown in FIGS. 4 and 5 is exemplary only and in other exemplary embodiments, various wet chemical cleaning operations may be used subsequent to various preceding processing operations with the protective film structure in place. The wet chemical cleaning operation need not necessarily follow a dry ashing operation that removes photoresist, for example.

Moreover, the structure illustrated in FIGS. 4 and 5 undergoing the ion implantation operation in step 24 is intended to be exemplary only. In other exemplary embodiments, polysilicon gate structures may be formed over the channel substrate 2 illustrated in FIGS. 4 and 5, and the film structure 8, 10 or capping film 18, may be formed thereover. In one exemplary embodiment, lower oxide film 8 and nitride film 10 or capping layer 18 may be formed over channel substrate 2 including over polysilicon gates formed over channel substrate 2, and a photoresist pattern may be formed to define self-aligned gate source/drain regions. An implantation operation may then take place and be followed by dry ashing and wet chemical cleaning operations prior to the removal of the protective films, nitride layer 10, lower oxide layer 8.

Nitride layer 10, lower oxide layer 8 and capping layer 18 may be easily removed using conventional wet stripping operations after the films have been utilized. The wet etching of nitride films is often performed in concentrated hot orthophosphoric acid, $H_3PO_4$ but other methods may also be used. Various wet etching oxide removal operations are known and available. In addition to the films being usable for multiple patterning implantation and cleaning operations taking place using the same set of films, the protective films of the disclosure may be formed and removed multiple times in the formation of a semiconductor device such as at an early processing stage for well definition and ion implantation and later for source/drain patterning and ion implantation after the formation of polysilicon leads on channel substrate 2.

According to one aspect, a method for forming a semiconductor device is provided. The method comprises providing a channel substrate of a substrate material being one of Ge, SiGe, GaAs, InP and InGaAs and a further Group III-V semiconductor material, forming a film structure comprising a nitride layer over the channel substrate, performing a plurality of ion implantation processing sequences, removing the film structure, and performing further processing operations.

According to another aspect, a further method for forming a semiconductor device is provided. The method comprises: providing a channel substrate of a substrate material being one of Ge, SiGe, GaAs, InP, InGaAs and a further Group III-V semiconductor material; forming a film structure comprising a nitride layer over the channel substrate; performing a plurality of ion implantation processing sequences; and, removing the film structure. The method further comprises: forming polysilicon gate structures over the channel substrate; forming a further film structure comprising a further nitride layer over the channel substrate including over the polysilicon gate structures; forming a photoresist pattern and performing a source/drain ion implantation; removing the photoresist layer; performing a wet chemical cleaning operation using at least one of HCl, HF, $HNO_3$, $H_2SO_4$, APM, HPM and Caros acid; and removing the further film structure.

The preceding merely illustrates the principles of the disclosure. It will thus be appreciated that those skilled in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those skilled in the art without departing from the scope and range of equivalents of the disclosure.

What is claimed is:

1. A method for forming a semiconductor device, said method comprising:
    providing a channel substrate of a substrate material being one of Ge, SiGe, GaAs, InP, InGaAs and a further Group III-V semiconductor material;
    forming a film structure comprised entirely of one or more continuous dielectric layers and including a continuous nitride layer, said film structure disposed directly on said channel substrate, wherein said forming a film structure comprises forming an oxide layer directly on said channel substrate and forming said continuous nitride layer directly on said oxide layer;
    performing at least one ion implantation processing sequence with said continuous nitride layer over said channel substrate;
    removing said film structure; and
    performing further processing operations.

2. The method as in claim 1, wherein said at least one ion implantation processing sequence comprises a plurality of said ion implantation processing sequences and wherein each said ion implantation processing sequence includes forming a photoresist pattern, removing said photoresist pattern and cleaning said channel substrate after said removing said photoresist pattern.

3. The method as in claim 2, wherein said cleaning said channel substrate comprises wet cleaning using at least one of HCl, HF, HNO$_3$, H$_2$SO$_4$, APM, HPM and Caros acid.

4. The method as in claim 2, wherein said substrate material comprises SiGe and said plurality of ion implantation processing sequences include at least one p-well ion implantation processing operation and at least one n-well ion implantation processing operation.

5. The method as in claim 1, wherein said performing at least one ion implantation processing sequence comprises a plurality of ion implantation processing sequences including a plurality of wet chemical cleaning operations, each said wet chemical cleaning operation utilizing at least one of HCl, HF, HNO$_3$, H$_2$SO$_4$, APM, HPM and Caros acid.

6. The method as in claim 1, wherein said providing a channel substrate comprises forming said channel substrate over a silicon wafer.

7. The method as in claim 1, wherein said forming a film structure comprises forming said film structure to be continuously conterminous with said channel substrate.

8. The method as in claim 1, wherein said channel substrate comprises an upper channel region of a substrate formed of said substrate material.

9. The method as in claim 1, wherein said providing a channel substrate includes forming shallow trench isolation (STI) structures within said channel substrate.

10. The method as in claim 1, wherein said continuous nitride layer comprises a silicon oxynitride layer and is continuously conterminous with said channel substrate.

11. The method as in claim 1, wherein said continuous nitride layer comprises silicon nitride.

12. The method as in claim 1, wherein said oxide layer includes a thickness of about 5-15 angstroms and said continuous silicon nitride includes a thickness of about 10-50 angstroms.

13. The method as in claim 1, wherein said forming an oxide layer comprises forming a chemical oxide layer using ozone and deionized water.

14. The method as in claim 1, wherein said channel substrate comprises a planar substrate.

15. The method as in claim 1, wherein said providing a channel substrate includes fin structures forming part of said channel substrate.

16. The method as in claim 1, wherein said further processing includes forming polysilicon gate structures over said channel substrate, forming a further film structure comprising at least a further nitride layer over said channel substrate including over said polysilicon gate structures, forming a photoresist pattern and performing a source/drain ion implantation, removing said photoresist pattern, performing a wet chemical cleaning operation using at least one of HCl, HF, HNO$_3$, H$_2$SO$_4$, APM, HPM and Caros acid, and removing said further film structure.

17. A method for forming a semiconductor device, said method comprising:
provide a channel substrate of a substrate material being one of Ge, SiGe, GaAs, InP, InGaAs and a further Group III-V semiconductor material;
forming a dielectric film structure comprised entirely of a continuous nitride layer and a further layer, directly contacting said channel substrate;
performing at least one ion implantation processing sequence with said dielectric film structure completely covering said channel substrate, each said ion implantation processing sequence including forming a photoresist pattern, removing said photoresist pattern and cleaning said channel substrate after said removing said photoresist pattern;
removing said dielectric film structure; and
performing further processing operations.

18. The method as in claim 17, wherein said further layer comprises an oxide layer, said dielectric film structure comprises said continuous nitride layer formed directly on said oxide layer and said oxide layer is a continuous layer conterminous with said channel substrate.

19. The method as in claim 17, wherein said providing a channel substrate includes fin structures forming part of said channel substrate and said continuous nitride layer comprises a silicon oxynitride layer.

20. The method as in claim 17, wherein said further processing includes
forming polysilicon gate structures over said channel substrate;
forming a further film structure comprising at least a further nitride layer over said channel substrate including over said polysilicon gate structures;
forming a photoresist pattern and performing a source/drain ion implantation;
removing said photoresist pattern;
performing a wet chemical cleaning operation using at least one of HCl, HF, HNO$_3$, H$_2$SO$_4$, APM, HPM and Caros acid; and
removing said further film structure.

21. A method for forming a semiconductor device, said method comprising:
providing a channel substrate of a substrate material being one of Ge, SiGe, GaAs, InP, InGaAs and a further Group III-V semiconductor material;
forming a dielectric film structure comprising one or more continuous dielectric layers and including a continuous nitride layer, said film structure disposed directly contacting said channel substrate, said dielectric film structure completely covering said channel substrate;
performing at least one ion implantation processing sequence with said dielectric film structure completely covering said channel substrate;
removing said film structure; and
performing further processing operations.

22. The method as in claim 21, wherein said further processing includes
forming polysilicon gate structures over said channel substrate;
forming a further film structure comprising at least a further nitride layer over said channel substrate including over said polysilicon gate structures;
forming a photoresist pattern and performing a source/drain ion implantation;
removing said photoresist pattern;
performing a wet chemical cleaning operation using at least one of HCl, HF, HNO$_3$, H$_2$SO$_4$, APM, HPM and Caros acid; and
removing said further film structure.

* * * * *